(12) United States Patent
Messina

(10) Patent No.: US 6,404,638 B1
(45) Date of Patent: Jun. 11, 2002

(54) SMALL GAPS COOLING TECHNOLOGY

(75) Inventor: Gaetano P. Messina, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/727,164

(22) Filed: Nov. 30, 2000

(51) Int. Cl.⁷ .................................................. H05K 7/20
(52) U.S. Cl. ........................ 361/715; 361/688; 361/704; 361/707; 257/706; 257/712; 257/718; 257/719; 257/727; 257/726; 174/16.3; 165/80.2; 165/185
(58) Field of Search ................................. 361/688, 704, 361/705, 707, 709, 710, 719–721; 257/706, 707, 717–720; 165/80.2, 80.3, 80.4, 185; 174/16.3, 15.1

(56) References Cited

U.S. PATENT DOCUMENTS

| 5,177,667 A |   | 1/1993 | Graham et al. |   |
| 5,239,200 A |   | 8/1993 | Messina et al. |   |
| 5,294,830 A |   | 3/1994 | Young et al. |   |
| 5,296,739 A | * | 3/1994 | Heilbronner et al. | 257/687 |
| 5,394,299 A | * | 2/1995 | Chu et al. | 361/705 |
| 5,517,753 A |   | 5/1996 | Messina |   |
| 5,705,850 A | * | 1/1998 | Ashiwake et al. | 257/714 |
| 5,862,038 A | * | 1/1999 | Suzuki et al. | 361/704 |
| 5,999,407 A | * | 12/1999 | Meschter et al. | 361/704 |
| 6,201,697 B1 | * | 3/2001 | McCullough | 361/704 |

* cited by examiner

Primary Examiner—Leo P. Picard
Assistant Examiner—Boris L. Chervinsky
(74) Attorney, Agent, or Firm—DeLio & Peterson, LLC; Peter W. Peterson

(57) ABSTRACT

The present invention provides a thermal conduction module assembly kit comprising a base being substantially planar in shape and adapted to receive on a top surface a substrate adapted to receive at least one integrated circuit having top and bottom surfaces. A cover is substantially rectangular, having top and bottom surfaces and an outer edge surface. The cover is designed to mate with the substrate such that the integrated circuit is positioned between the bottom surface of the cover and the top surface of the substrate. A removable shim member is planar in shape and has a definable vertical dimension positioned between the bottom surface of the cover and the top surface of the integrated circuit to provide a specified dimension between the top surface of the integrated circuit and the bottom surface of the cover. A positioning member has top, bottom, and inner surfaces, and is substantially circular. The inner surface of the positioning member is positioned to circumscribe and movably mate with the outside surface of the cover. The inner surface of the positioning member is affixable to the outer edge surface of the cover, and the bottom surface of the positioning member is contactable with the top surface of the substrate. The affixable inner surface of the spacer, and the bottom surface of the affixable positioning member, are capable of maintaining the vertical dimension between the bottom surface of the cover and the top surface of the integrated circuit defined by the specified vertical dimension of the shim member, and define a gap of the same specified vertical dimension after the removable shim member is removed. The gap substantially receives a thermally conductive medium.

32 Claims, 6 Drawing Sheets

US 6,404,638 B1

SMALL GAPS COOLING TECHNOLOGY

BACKGROUND OF THE INVENTION

1. Field of the Invention

This invention relates to an apparatus for cooling integrated circuit chips and, in particular, to a thermal conduction module and a method of adjustment and assembly thereof.

2. Description of Related Art

Integrated circuit chips mounted in an array on substrates present special cooling difficulties. While chip size has increased over the years and power usage is more efficient than in the past, work is still needed on cooling systems and methods to remove the relatively high density power dissipated by the chips. The prior art is replete with different types of thermal conduction modules (TCMs) designed to enclose and cool integrated circuit chips mounted on ceramic-glass substrates. In some instances, the TCMs utilize liquid coolants to cool the chips, such as those described in U.S. Pat. Nos. 5,239,200, 5,294,830 and 5,177,667, issued to the assignee of this application. Another approach to cooling has been described in U.S. Pat. No. 4,500,945, also assigned to the assignee of this application, by the use of pistons contacting the chips within the TCMs to remove heat.

A further approach in cooling chips in TCMs has been to utilize a thermally conductive medium, such as high thermal conductivity pastes, between the top of the integrated circuit chip mounted on the substrate and the lower surface of the cover plate facing the substrate. An example of the useful, stable, high solid content, high thermal conductivity paste is disclosed in U.S. Pat. No. 5,098,609. This compound can be applied as a thin film between the top of the chip and the lower surface of the cover of the TCM. In order to properly control the amount of heat removed from the integrated circuit chip, it is desirable to determine a gap of a specified and desired fixed distance between the top of the chip and the lower surface of the cover, and to fill that space completely with the thermally conductive medium such as the aforementioned paste.

Prior art methods of setting the proper gap between the top surface of the chip and the lower surface of the cover have utilized an integral spacer within the thermal conduction module to control the size of the gap. This spacer is normally integral with the cover plate and extends around the periphery of the area of the substrate on which the integrated surface chips are mounted.

Glass ceramics which are normally used as substrate materials for the integrated circuit chips are brittle and easy to break, and must be handled with care. The substrates are normally mounted in a base plate of the TCM which encompasses the edges of the substrate. The cover plate is normally secured to this base plate surrounding the substrate following assembly of the TCM. It has been found that the use of the integral spacer in the TCM can contribute to breakage of the glass ceramic substrates when the cover plate is fastened too tightly to the base plate. This has been found to occur because the integral spacer transfers force directly to the substrate when the fasteners, typically screws or bolts around the periphery of the cover plate, are tightened down to the base plate. The substrate, which is contained within the base plate by a lip extending within its periphery, is then subject to excessive and uneven forces from the spacer which may not be in direct line with the lip of the base plate. The application of excessive force to the fasteners will then tend to break the substrates near the lip of the base plates. Because parallelism of the lower surface of the cover plate and the tops of the integrated surface chips must be maintained in all assembled parts, an even distribution force must be applied around the periphery of the thermal conduction module.

Bearing in mind the problems and deficiencies of the prior art, it is therefore an object of the present invention to provide a thermal conduction module which may be assembled with a controlled gap between the lower surface of the cover plate and the upper surface of the integrated circuit chip without causing excessive force and breakage to the chip substrate, whereby a desired thermally conductive medium may be applied between the chip and the cover plate to effect controlled heat removal and cooling of the chip.

It is another object of the present invention to provide a method of assembling a thermal conduction module which reduces the possibility of breakage of the chip substrate while maintaining a controlled gap between the cover plate and the top surface of the integrated circuit chips for insertion of a thermally conductive medium.

A further object of the invention is to provide a thermal conduction module in which the cover plate may be secured to the base plate with higher loading on the fasteners with a reduced possibility of damage to the chip substrate.

It is yet another object of the present invention to provide an apparatus for cooling integrated circuit chips mounted on a substrate by providing an adjustable spacer between the apparatus cover plate and base plate which does not bear directly on the substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a thermal conduction module assembly kit comprising a base having top and bottom surfaces and being adapted to receive a substrate on its top surface. The substrate is adapted to receive at least one integrated circuit having top and bottom surfaces. The thermal conduction module assembly kit also includes a cover having top and bottom surfaces and an outer edge surface. The cover is adapted to be disposed over the substrate. The integrated circuit is positioned between the bottom surface of the cover and the top surface of the substrate. Further, a removable spacer member has a definable vertical dimension and is positioned between the bottom surface of the cover and the top surface of the integrated circuit. A positioning member has top, bottom, and side surfaces. The side surface of the positioning member situated adjacent to and being affixable to, the outer edge surface of the cover; and the bottom surface of the positioning member is contactable with the top surface of the substrate. The positioning member is slidable along the affixable side surface with respect to the outer edge surface of the cover, to contact the top surface of the substrate and maintain a specified vertical dimension between the bottom surface of the cover and the top surface of the integrated circuit; the specified vertical dimension is defined by the vertical dimension of the removable spacer member.

In a related aspect, the thermal conduction module assembly kit has the bottom surface of the cover and the top surface of the integrated circuit defining a gap having the specified vertical dimension when the affixable side surface of the positioning member is affixed to the outer edge surface of the cover, and the removable space member is removed. The gap is substantially filled with a thermally conductive medium.

In another aspect, the present invention provides a thermal conduction module assembly kit comprising a base having top and bottom surfaces, and a substrate having top and bottom surfaces. The bottom surface of the substrate is adapted to be situated on the top surface of the base. At least one integrated circuit has top and bottom surfaces, where the bottom surface of the integrated circuit is adapted to be positioned on the top surface of the substrate. A cover has top and bottom surfaces and an outer edge surface. The cover is adapted to be disposed over the substrate, the integrated circuit is positioned between the bottom surface of the cover and the top surface of the substrate. A removable spacer member has a definable vertical dimension positioned between the bottom surface of the cover and the top surface of the integrated circuit. A positioning member has top, bottom, and side surfaces. The side surfaces of the positioning member are situated adjacent to and affixable to, the outer edge surface of the cover; and the bottom surface of the positioning member is contactable with the top surface of the substrate. The affixable side surface of the positioning member, and the bottom surface of the affixable positioning member, are capable of maintaining a specified vertical dimension between the bottom surface of the cover and the top surface of the integrated circuit. The specified vertical dimension is defined by the vertical dimension of the removable spacer member. The bottom surface of the cover and the top surface of the integrated circuit define a gap having the specified vertical dimension when the affixable side surface of the positioning member is affixed to the outer edge surface of the cover, and the removable space member is removed. The gap is filled with a thermally conductive medium.

A related aspect of the invention provides the positioning member at least partially circumscribing the cover.

Another related aspect provides the positioning member and the cover substantially circular in shape and the positioning member circumscribing an outer surface of the perimeter of the substantially circular cover.

Yet another related aspect provides a plurality of covers that are affixable to the positioning member. In yet another aspect, the present invention provides a thermal conduction module assembly kit comprising a base being substantially planar in shape and adapted to receive on a top surface a substrate adapted to receive at least one integrated circuit having top and bottom surfaces. A cover is substantially rectangular, having top and bottom surfaces and an outer edge surface. The cover is designed to mate with the substrate such that the integrated circuit is positioned between the bottom surface of the cover and the top surface of the substrate. A removable shim member is planar in shape and has a definable vertical dimension positioned between the bottom surface of the cover and the top surface of the integrated circuit to provide a specified dimension between the top surface of the integrated circuit and the bottom surface of the cover. A positioning member has top, bottom, and inner surfaces, and is substantially circular. The inner surface of the positioning member is positioned to circumscribe and movably mate with the outside surface of the cover. The inner surface of the positioning member is affixable to the outer edge surface of the cover, and the bottom surface of the positioning member is contactable -with the top surface of the substrate. The affixable inner surface of the spacer, and the bottom surface of the affixable positioning member, are capable of maintaining the vertical dimension between the bottom surface of the cover and the top surface of the integrated circuit defined by the specified vertical dimension of the shim member, and define a gap of the same specified vertical dimension after the removable shim member is removed. The gap substantially receives a thermally conductive medium.

In yet another aspect, the present invention provides an apparatus for deploying a thermal conduction module comprising a structure defining an inner cavity. The structure includes an upper portion and a lower portion where the upper portion of the structure defines an opening. The module includes a substrate having a top and bottom surface, the bottom surface of the substrate is positioned on a top surface of the lower portion of the structure. The substrate is adapted to receive at least one integrated circuit having top and bottom surfaces, where the bottom surface of the integrated circuit is positioned on the top surface of the substrate. The module further includes a cover having top and bottom surfaces and an outer edge surface. The cover is adapted to be disposed over the substrate. The module further includes at least one positioning member. The positioning member has an inner surface being adjacent to, and affixable to the outer edge surface of the cover. The integrated circuit is positioned between the bottom surface of the cover and the top surface of the substrate. The module further includes a removable shim member having a definable vertical dimension and being positioned between the bottom surface of the cover and the top surface of the integrated circuit to provide a specified vertical dimension between the top surface of the integrated circuit and the bottom surface of the cover. An application member is positioned through the opening in the top of the structure. An actuation member is connected to the application member for lifting the application member in a substantially vertical direction. The apparatus further includes at least one adjustment element adjacent to the application member and connected to the application member so that both move synchronously. The adjustment element has a lower portion contacting an upper surface of the positioning member. The positioning member is vertically slidable by the adjustment element along the outer edge surface of the cover, such that the actuation member moves the adjustment element to position the positioning member in a desired adjacent position relating to the vertical dimension of the removable shim member.

A related aspect provides that the inner cavity is substantially circular, and the cover and the positioning member are substantially circular such that the positioning member circumscribes the outer edge of the cover.

Another related aspect provides that the inner cavity is substantially rectangular, and the cover and the positioning member are substantially rectangular such that the positioning member circumscribes the outer edge of the cover.

Yet another related aspect provides that the affixable inner edge surface of the positioning member, and the bottom surface of the affixable positioning member, are coupled to maintain the vertical dimension between the bottom surface of the cover and the top surface of the integrated circuit defined by the specified, measurable vertical dimension of the shim member. The bottom surface of the cover and the top surface of the integrated circuit defining a gap after the removable shim member is removed; and the gap has substantially the same specified, measurable vertical dimension of the shim member. The gap is substantially filled by a thermally conductive medium.

In yet another aspect, the present invention provides an apparatus for deploying a thermal conduction module assembly kit comprising a structure defining an inner cavity. The structure includes an upper portion and a lower portion, where the upper portion of the structure defines an opening. A substrate has a top and bottom surface. The bottom surface of the substrate is positioned on a top surface of the lower portion of the structure. At least one integrated circuit having top and bottom surfaces, where the bottom surface of the integrated circuit is positioned on the top surface of the substrate. A cover is substantially rectangular, and has top and bottom surfaces and an outer edge surface. The cover is adapted to be disposed over the substrate, and the integrated circuit is positioned between the bottom surface of the cover and the top surface of the substrate. A removable shim member is planar in shape and has a definable vertical dimension positioned between the bottom surface of the cover and the top surface of the integrated circuit to provide a specified dimension between the top surface of the integrated circuit and the bottom surface of the cover. An application member is positioned through the opening in the top of the structure. An actuation member is connected to the application member for lifting the application member in a substantially vertical direction. At least one adjustment element adjacent to the application member and connected to the application member so that both move synchronously, the adjustment element has a lower portion contacting at least one positioning member. The positioning member has an inner surface being adjacent to, substantially circumscribing, and affixable to the outer edge surface of the cover. The positioning member is vertically slidable by the adjustment element along the outer edge surface of the cover.

A related aspect provides that the affixable inner edge surface of the positioning member, and the bottom surface of the affixable positioning member, are coupled to maintain the vertical dimension between the bottom surface of the cover and the top surface of the integrated circuit defined by the specified, measurable vertical dimension of the shim member. The bottom surface of the cover and the top surface of the integrated circuit define a gap after the removable shim member is removed; and the gap has substantially the same specified, measurable vertical dimension of the shim member. The gap is substantially filled by a thermally conductive medium.

Another related aspect provides that the bottom portion of the structure includes a top surface defining a recess, the recess is adapted to hold the substrate.

Yet another related aspect provides at least one spring positioned between a bottom surface of the top portion of the substantially rectangular structure and the top surface of the application member. The spring providing substantially downwardly transmitting force on the application member for articulation of the application member by the actuation member, and forgivingly providing pressure to the positioning member.

Yet another related aspect provides a plurality of covers that are affixable to the positioning member.

In yet another aspect, the present invention provides a method of assembling a thermal conduction module having a base plate for holding at least one integrated circuit chip mounted on a chip substrate. A cover plate has a surface facing the chip substrate; a positioning member adjacent to the cover plate; and an application member removably fastened to the cover plate, the application member is adjustable to a predetermined distance from the cover plate or base plate. The method comprises placing a substrate on the base plate; placing at least one integrated circuit chip on the substrate; placing a removable shim member over an upper surface of the substrate and, at least one integrated circuit chip. The shim member has a thickness corresponding to a thickness sufficient to permit a thermally conductive medium to be disposed between an upper surface of the integrated circuit chip, when located on the chip substrate, and the cover plate surface facing the chip substrate, when the shim member is removed. Placing the cover plate over the shim member, the integrated circuit chip, if present, the substrate and the base plate. Adjusting the application member toward or away from the base plate, until the surface facing the chip substrate of the cover plate contacts the shim member creating a desired distance for insertion of a thermally conductive material between an upper surface of an integrated circuit chip mounted on the chip substrate and the cover plate surface facing the chip substrate. Affixing the positioning member to the cover plate. Removing the cover plate with affixed positioning member and shim member from over the substrate. Replacing the cover plate with affixed positioning member over the substrate and the base plate. Securing the cover plate with affixed positioning member to the base plate, whereby a desired gap is created for a thermally conductive medium between an upper surface of the integrated circuit and the cover plate surface facing the chip substrate, and inserting the thermally conductive material into the gap.

In yet another aspect, the present invention provides a thermal conduction module assembly kit comprising a cover having top and bottom surfaces, a structure having upper and lower surfaces, where the upper structure surface is matable with the lower surface of the cover. At least one holding element having a top surface and a bottom surface; the holding element being resiliently coupled to the structure such that the holding element is movable in a substantially vertical direction. A substrate member having an upper surface and a bottom surface. The upper surface of the substrate member being adapted to mount at least one integrated circuit, the integrated circuit having an upper surface. A base having an upper surface, the upper surface of the base is adapted for the substrate member to be positioned on the base upper surface. A removable shim element being adapted to fit over the at least one integrated circuit, and the removable shim element being positioned between the integrated circuit and the holding element; the removable shim member having a specified thickness. The removable shim element specified thickness defining the distance between the upper surface of the integrated circuit and the holding element. The holding element and the structure are couplable. The cover and the structure coupling to the substrate base such that the holding element, removable shim element and the integrated circuit mounted in the substrate member are adapted to adjust to the specified thickness of the removable shim element. The specified thickness of the removable shim element defines a specific vertical dimension between the upper surface of the integrated circuit and the holding element.

A related aspect provides that the holding element is coupled to the structure and the removable shim element is removed. The upper surface of the integrated circuit and the holding element define a gap. The gap is substantially the same as the vertical dimension of the removable shim element. The gap is substantially filled by a thermally conductive medium.

Another related aspect provides that the cap member defines at least one opening, and the opening is designed to receive the resilient element and the holding element such that the holding element is capable of substantially receding into the opening while maintaining forgiving contact with the integrated circuit.

Yet another related aspect provides that the cap member defines at least one aperture providing ventilation for the gap.

In yet another aspect, the present invention provides a thermal conduction module assembly kit comprising, a cover having top and bottom surfaces, and a structure having upper and lower surfaces. The upper structure surface is matable with the lower surface of the cover. The structure defines at least one aperture. At least one holding element having a top surface and a bottom surface, and the holding element is coupled to the structure by a resilient element such that the holding element is movable in a substantially vertical direction. The aperture of the structure is adapted to accept the holding element such that the holding element is capable of resiliently vertically adjusting within the aperture. A substrate member having an upper surface and a bottom surface, where the upper surface of the substrate member is adapted to mount at least one integrated circuit. The integrated circuit has an upper surface. The base has an upper surface, which is adapted for the substrate member to be positioned on the base upper surface. A removable shim element is adapted to fit over the integrated circuit, and the removable shim element is positioned between the integrated circuit and the holding element. The removable shim member has a defined thickness and the thickness defines the distance between the upper surface of the integrated circuit and the holding element. The holding element and the structure are couplable. The cover and the structure couple to the substrate base such that the holding element, removable shim element and the integrated circuit mounted in the substrate member are adapted to adjust to the thickness dimension of the removable shim element. The defined thickness of the removable shim element defines a specific vertical dimension between the upper surface of the integrated circuit and the holding element.

A related aspect provides that when the holding element is affixed to the structure and the removable shim element is removed; the upper surface of the integrated circuit and the holding element define a gap. The gap is substantially the same as the vertical dimension of the removable shim element. The cover is affixed to the substrate base. The gap is substantially filled by a thermally conductive medium.

Another related aspect provides that the holding structure defines at least one aperture providing ventilation of the gap.

Yet another related aspect provides that the holding structure comprises a plurality of substantially circular apertures.

Yet another related aspect provides that the cover defines at least one aperture for venting the module.

Yet another related aspect provides that the cover defines at least one aperture for venting the module, and the aperture extending through the cover a specified distance reaching the upper surface of the integrated circuit.

Yet another related aspect provides adjustment elements passing through the top cover, the structure, and the base which can provide incremental changes in the positioning of the holding elements as the holding elements contact the removable shim.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3b is a partially assembled exploded view of the embodiment shown in FIG. 3a.

DESCRIPTION OF THE PREFERRED EMBODIMENTS

Figure 1A:
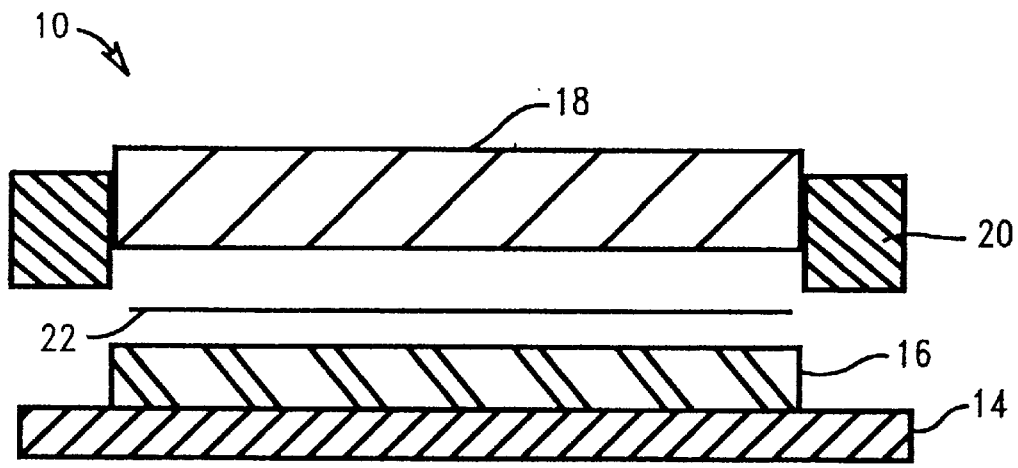
FIG. 1a is a cross sectional view of a thermal conduction module assembly kit.

In describing the preferred embodiment of the present invention, reference will be made herein to FIGS. 1–5 of the drawings in which like numerals refer to like features of the invention. Features of the invention are not necessarily shown to scale in the drawings.

Figure 1B:
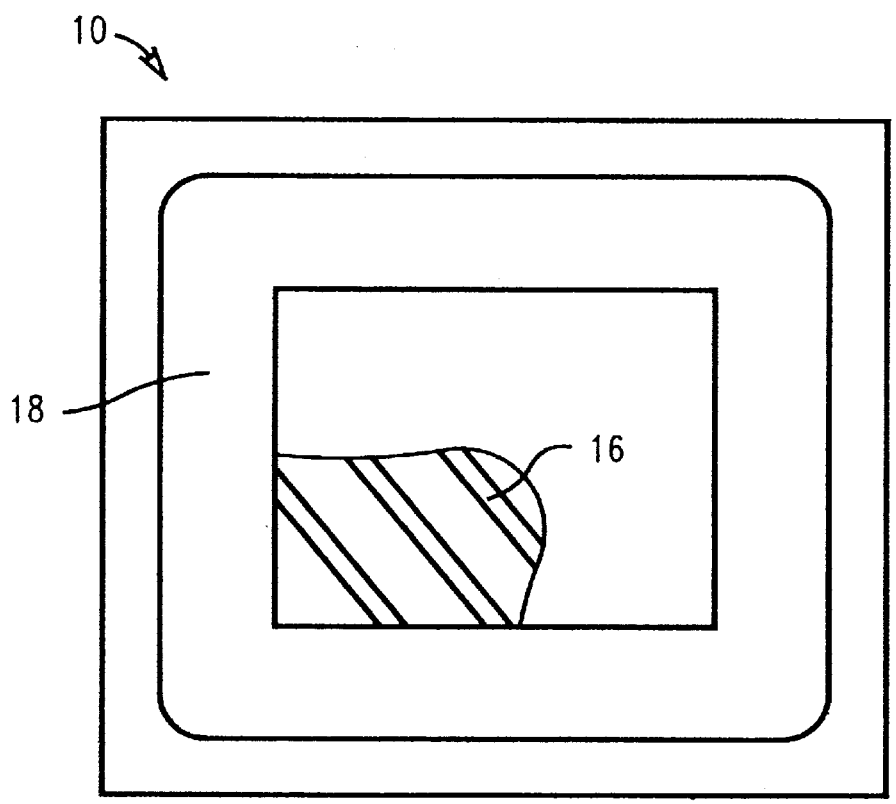
FIG. 1b is a cut away planar view of the assembly kit of FIG. 1a assembled.

Referring to FIGS. 1a and 1b a thermal conduction module assembly kit 10 is shown which preferably has a rectangular geometry, however, other geometries such as circular are also acceptable. The module 10 includes a preferably square or rectangular shaped substrate 14. The substrate 14 is designed to accept an integrated circuit 16 such that the bottom of the integrated circuit is fitted to the substrate 14. A square or rectangular shaped cover 20 is designed to fit over, contact, and couple with the substrate 14. A positioning ring 20 circumscribes the perimeter of the cover 18. The module 10 is shown assembled 11 in FIG. 1b.

A shim member 22 is positioned between the integrated circuit 16 and the cover 18. The shim member 22 in this embodiment is preferably rectangular in shape but can also be other geometries such as circular, or other shapes providing the function disclosed herein. The shim member 22 has a predetermined thickness that provides a desired space between the integrated circuit 16 and the bottom of the cover 18, when the thermal conduction module 10 is assembled.

Further, the shim member 22 is removable. Once the module 10 is assembled with the shim member 22 in place, the positioning ring 20 is situated so that its bottom is resting on the substrate 14. Manipulation of the size of the gap is accurately achieved by adjusting the size (vertical dimension) of the shim. The positioning ring 20 configuration can achieve a gap vertical dimension necessary to apply a film over the integrated circuit or much more thermally conductive material.

The positioning ring 20 is then affixed to the cover 18 preferably using an adhesive, for example, an epoxy or solder. The shim member 22 can now be removed and a gap is defined by the top of the integrated circuit 16 and the bottom of the cover 18. The gap has a vertical dimension equal to the thickness or vertical dimension of the shim member 22. The gap is sustained by the positioning ring 20 being in contact with the substrate 14 and affixed to the cover. The gap is filled with a thermally conductive medium, or thermal compound, for example, ATC. Heat from the integrated circuit 16 is substantially dissipated via the thermally conductive material, the cover and, if used, the solder.

Figure 2B:
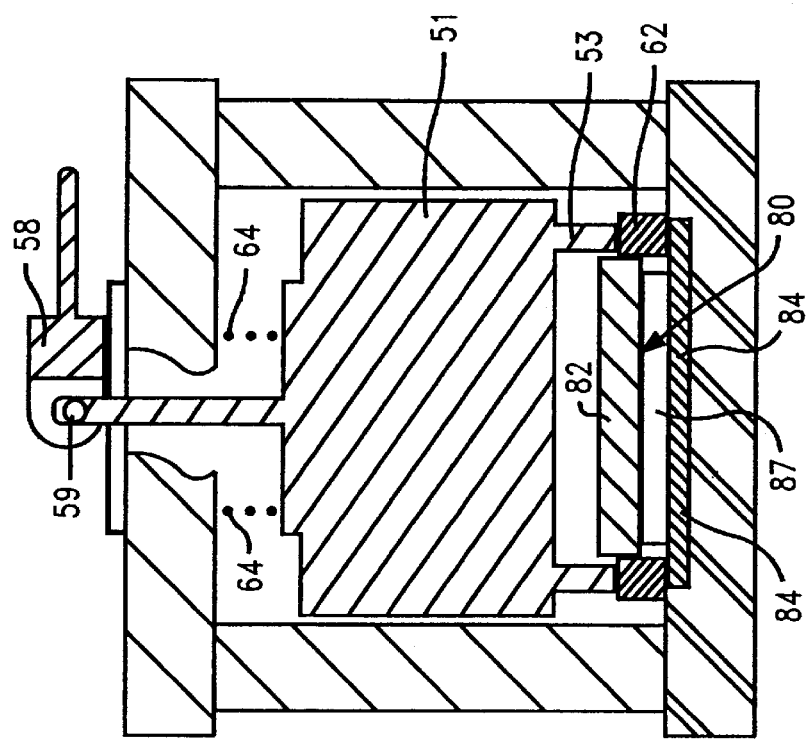
FIG. 2b is a cross sectional view of another apparatus for deploying a thermal conduction module after deployment.
Figure 2A:
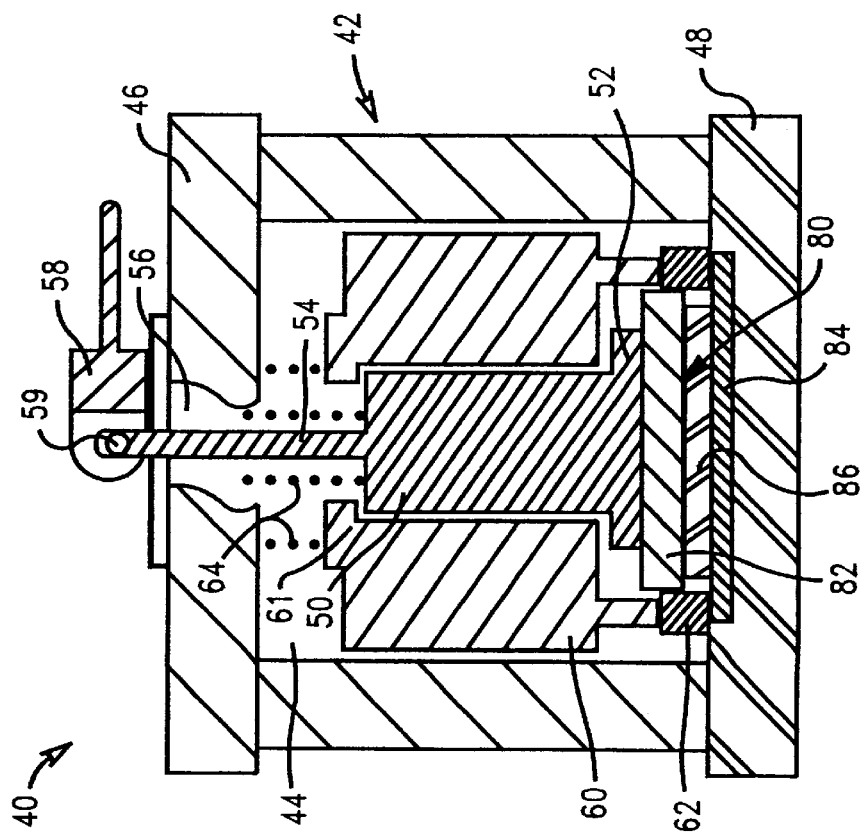
FIG. 2a is a cross sectional view of an apparatus for deploying a thermal conduction module while in deployment.

Referring to FIGS. 2a and 2b, two embodiments of apparatuses 40 for deploying a thermal conduction module 80 are shown having substantially similar construction, however, having some differences in internal structure. The apparatuses 40 shown in FIGS. 2a and 2b include an enclosure structure 42 having a circular hollow center area 44, and a top 46 and bottom 48. The apparatus shown in FIG. 2a includes an application pusher 50 which is generally cylindrical in shape and includes a lower portion 52, and an upper portion 54. The upper portion 54 extends through a hole 56 in the top 46 of the enclosure structure 42. An actuation handle 58 is connected at a pivot point 59 to the upper portion 54 of the application pusher 50.

The apparatuses 40 shown in FIGS. 2a and 2b further include, a thermal conduction module 80, which is essentially the same as the module 10 shown in FIGS. 1a and 1b, having a cover 82, a substrate 84, a shim 86 (shown in FIG. 2a), thermal compound 87 (shown in FIG. 2b) and an integrated circuit (not shown). The integrated circuit is mounted on top of the substrate 84, and the shim 86 is positioned between the integrated circuit and the cover 82. The cover 82 is designed to be positioned over the integrated circuit, leaving a portion of the substrate exposed. A specific measurable distance is created between the cover 82 and the integrated circuit corresponding to the vertical dimension of the shim 86. The module 80 is positioned in a recessed area in the bottom 48 of the enclosure structure 42, such that the substrate 84 generally fits into the recessed area.

Referring to the apparatus embodiment shown in FIG. 2a, two adjustment ring pushers 60 partially circumscribe the application pusher 50. The top of the adjustment ring pushers 60 include flanges 61 which make contact with the top of the application pusher 50, and the bottom of the adjustment ring pusher 60 contacts the top of an adjustment ring 62. The adjustment ring 62 circumscribes the perimeter of the cover 82. The bottom of the adjustment ring 62 contacts the top of the exposed substrate 84. The adjustment ring pusher 60 is spring loaded to forgivingly contact the adjustment ring 62. The springs 64 are connected to the top of each adjustment ring pusher 60 so that they can act independently of each other. The spring loaded adjustment ring 62 provides substantial prevention of damaging contact with the substrate 84.

The lower portion 52 of the application pusher 50 is removably connected to the top of the cover 82 of the module 80. Thereby, the application pusher 50 can vertically adjust the cover 82. When manipulating the cover, the application pusher 50 can align the perimeter of the cover 82 with the adjustment ring 62. If the application pusher 50 attempts to lift the cover above the adjustment ring 62, the flanges 61 at the top of the adjustment ring pushers 60 contact the top of the application pusher lifting the cover and adjustment ring off the shim and substrate respectively, thereby maintaining contact between the cover 82 and the adjustment ring 62.

Once the cover 82 is positioned on top of the shim 86 and the bottom of the adjustment ring 62 is positioned on the top of the substrate, portions of the inner edge of the adjustment ring can be affixed to the perimeter of the cover 82 using a quick curing epoxy or solder or a similar substance performing an equivalent function. The shim can then be removed to produce a gap between the cover and the integrated circuit. The gap can be filled by injection of a thermal compound such as, for example, ATC.

Referring to the apparatus embodiment shown in FIG. 2b, a controlling member 51 has lower portions 53 removable affixed to the adjustment ring 62. The controlling member 51 is manipulated using the actuation handle 58 to raise and lower the controlling member 51 in unison with the adjustment ring 62 thereby aligning the adjustment ring with the cover 82. As shown in FIG. 2b, the adjustment ring is affixed to the cover and the shim 86 has been removed. The resulting gap is filled with thermally conductive compound 87.

Figure 3A:
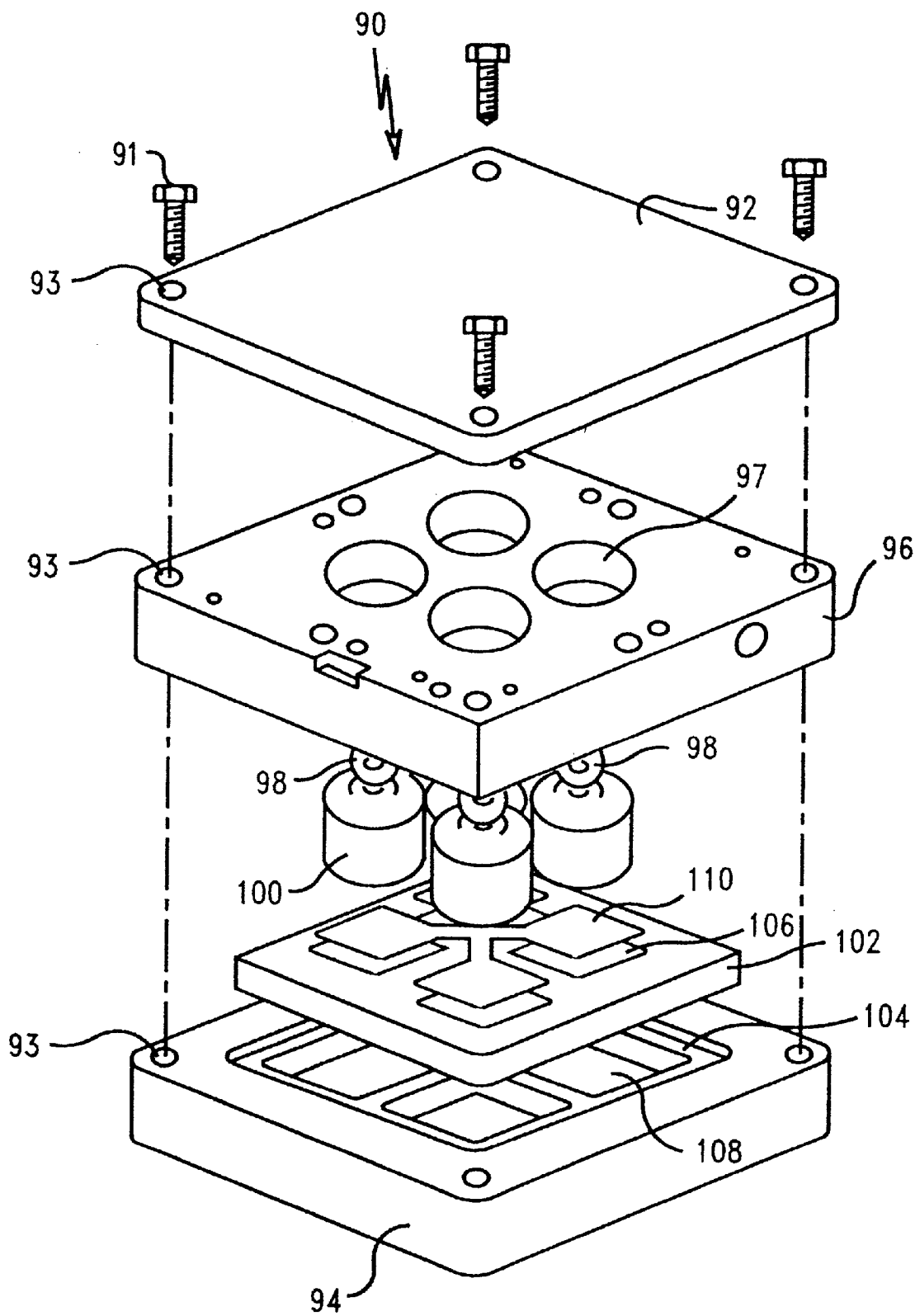
FIG. 3a is an exploded view of another embodiment of a thermal conduction module assembly kit.
Figure 3B:
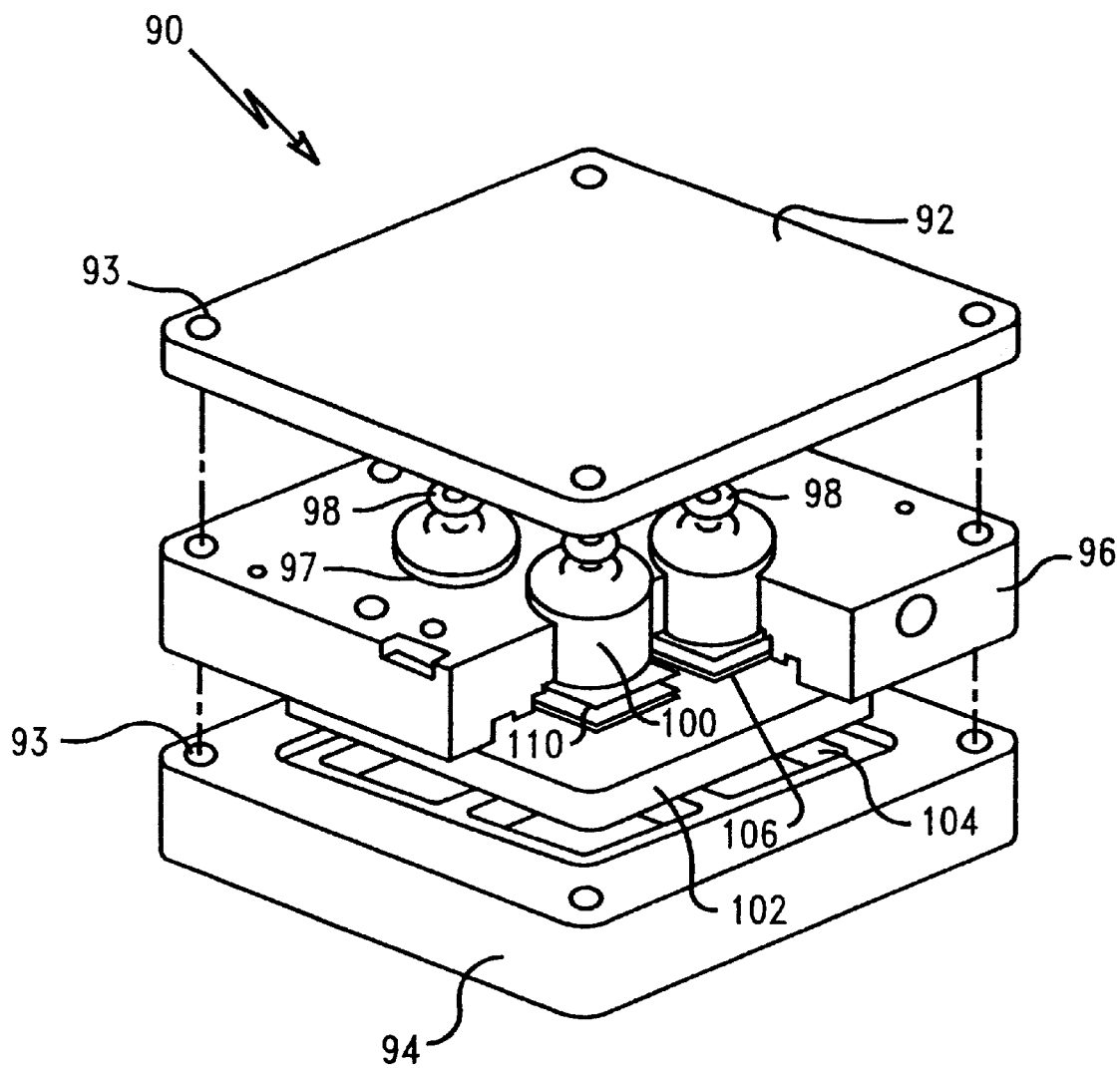

Referring to FIGS. 3a and 3b, another preferred embodiment of a thermal conduction module assembly kit 90 is shown. The module 90 includes a covering plate 92 substantially rectangular, and having four apertures 93, one towards each corner and extending vertically through the covering plate 92. The module 90 further includes a base 94, being substantially rectangular in shape and having four apertures 93, one towards each corner, aligning with the apertures 93 in the covering plate 92. The base 94 is further designed to have four recessed areas 108 which are designed to hold integrated circuits 106. Although the preferred embodiment shown herein is rectangular, other geometries can be used, such as, circular.

The module 90 further includes a positioning member or holding structure 96. The holding structure 96 is shaped rectangularly and includes four apertures 93 towards each corner, and is designed to mate with the covering plate 92, such that the apertures 93 on the cover and holding structure line up for screws 91 to access both. Four openings 97 house four holding elements 100 and their attached springs 98. The near end of the springs 98 can pass through the opening 97 and contact the cover 92. The distal end of the springs 98 contact the holding element 100 to provide a spring tension to the holding element 100 in the downward direction toward the shim 110. The holding elements 100 or cylindrically shaped covers are movably received in their corresponding openings in the positioning member or holding structure 96. Thus, the spring 98 and holding element 100 arrangement provides a spring loaded holding element which can apply forgiving pressure to the shim 110.

The module 90 further includes a substrate plate 102. The substrate plate 102 is rectangular in shape and designed to fit in a recessed area 104 in the base 94. The substrate plate 102 is designed to hold four integrated circuits placed equidistant from each other on the substrate plate 102.

The removable shim 110 is designed to fit over each integrated circuit 106 and under each holding element 100. Thus, the removable shim 110 fits between the holding element 100 and the integrated circuits 106. The removable shim 110 has four rectangular pieces joined by interconnecting pieces in the center. The removable shim 110 has a predetermined and specific thickness or vertical dimension. The vertical dimension corresponds to a desired gap dimension, between the top of the integrated circuit and the bottom of the holding elements 100 that will be filled with thermally conductive material.

The module 90 allows for the thickness determined by the shim 110 to be different from each integrated circuit 106. The apertures on the covering plate 92 aligning with the apertures on the base 94 are designed to receive screws 91 which can be gradually and incrementally tightened and loosened at each individual location to tilt the holding element 100 to produce a desired vertical dimension defined by the shim. The adjustment screws 91, positioned through the apertures 93, allow manipulation of the cylindrical holding elements 100 to adjust to the height and shape of the shim 110. Thus, the gap height can be adjusted by positioning the holding elements 100 using the removable shim 110. The gap size is thereby adjustable to a size to accept a film of thermally conductive material or substantial layer of thermally conductive material.

When the cylindrical holding elements 100 are ready to be positioned over the integrated circuits 106, the cylindrical holding elements 100 are affixed to the holding structure 96 and/or to the inner surface and edge of the openings 97 in the holding structure 96. The holding elements 100 are affixed preferably using solder which is applied into a gap between the holding elements 100 and the inner surface of the opening 97 in the holding structure 96. The module 90 is fixed together using screws 91 through the aligned apertures 93 in the plate 92 and the base 94. Tightening the screws 91 spring loads the holding elements 100 fixed in the openings 97 of the holding structure 96 over the shim 110 and the integrated circuits.

After the holding elements 100 are soldered into place, and the preferred embodiment shown in FIGS. 3a and 3b is assembled using the screws 91, the gap between the integrated circuit and the holding element needs to be set. To set the gap, the module 90 preferably is heated and then cooled to utilize the spring loaded tension of the holding elements 100. When assembled, the module 90 is heated to an elevated temperature to liquefy the solder. At this time, the holding elements 100 are released from being secured to the holding element inner surface. The springs 98 then force the holding elements 100 to move towards the integrated circuit contacting the shim 110.

More specifically, the module 90 is heated, which melts the solder holding the spring loaded holding elements 100. The holding elements thereby contacts the removable shim with a force provided by the spring in the downward direction, toward the shim 110. When the module 90 is cooled, the holding elements 100 are secured in their new position to the openings 97 inner surface and edge by the solidifying solder. Thus, cooling the assembled module 90 allows the holding elements 100 to freeze into the new position, because of the solidified solder, of contacting the shim 110. The holding elements 100 are now secured in their new position contacting the shim 110.

Figure 4:
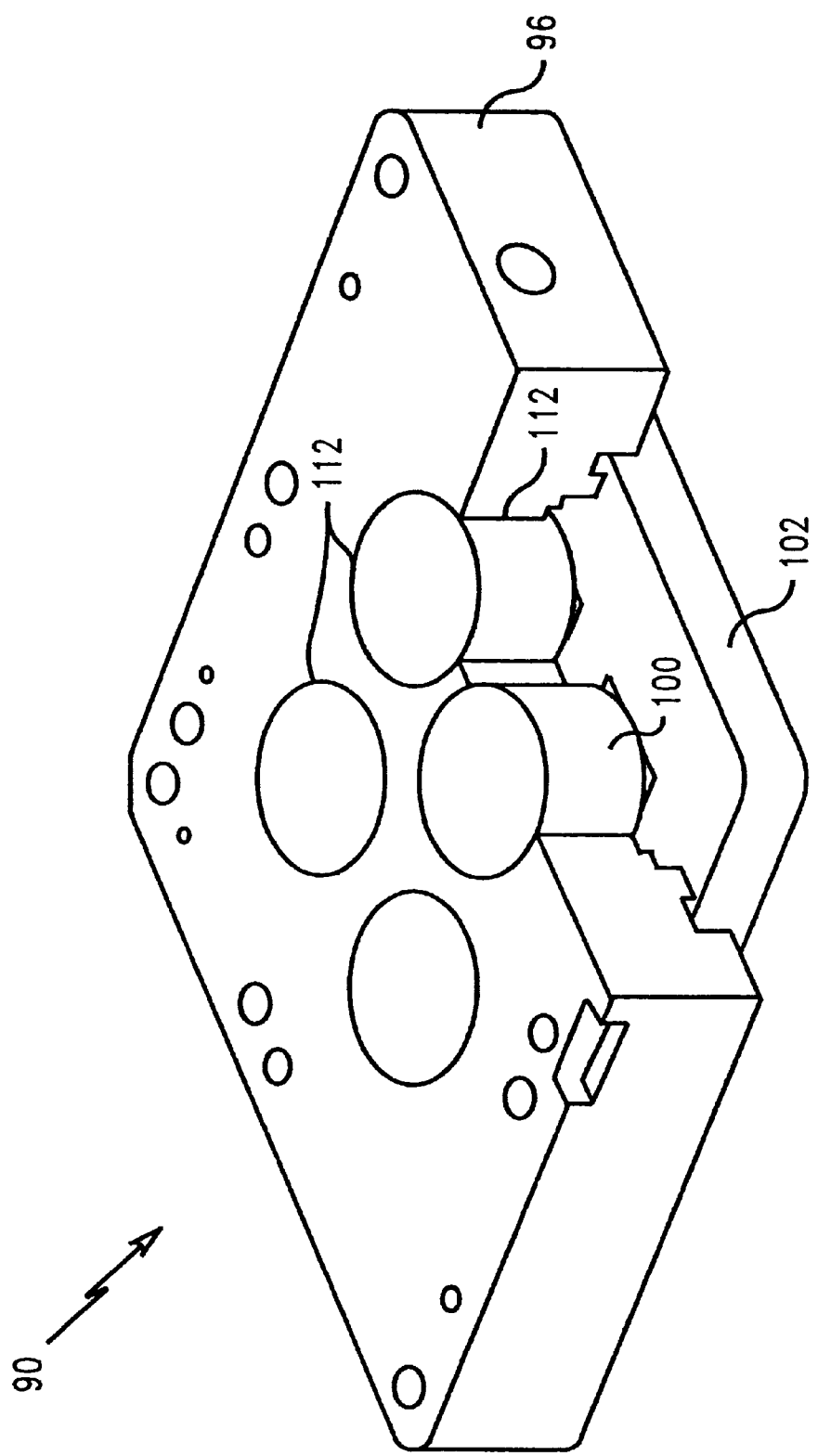
FIG. 4 is a cut-away planar view of the partially assembled module shown in FIG. 3.
Figure 5:
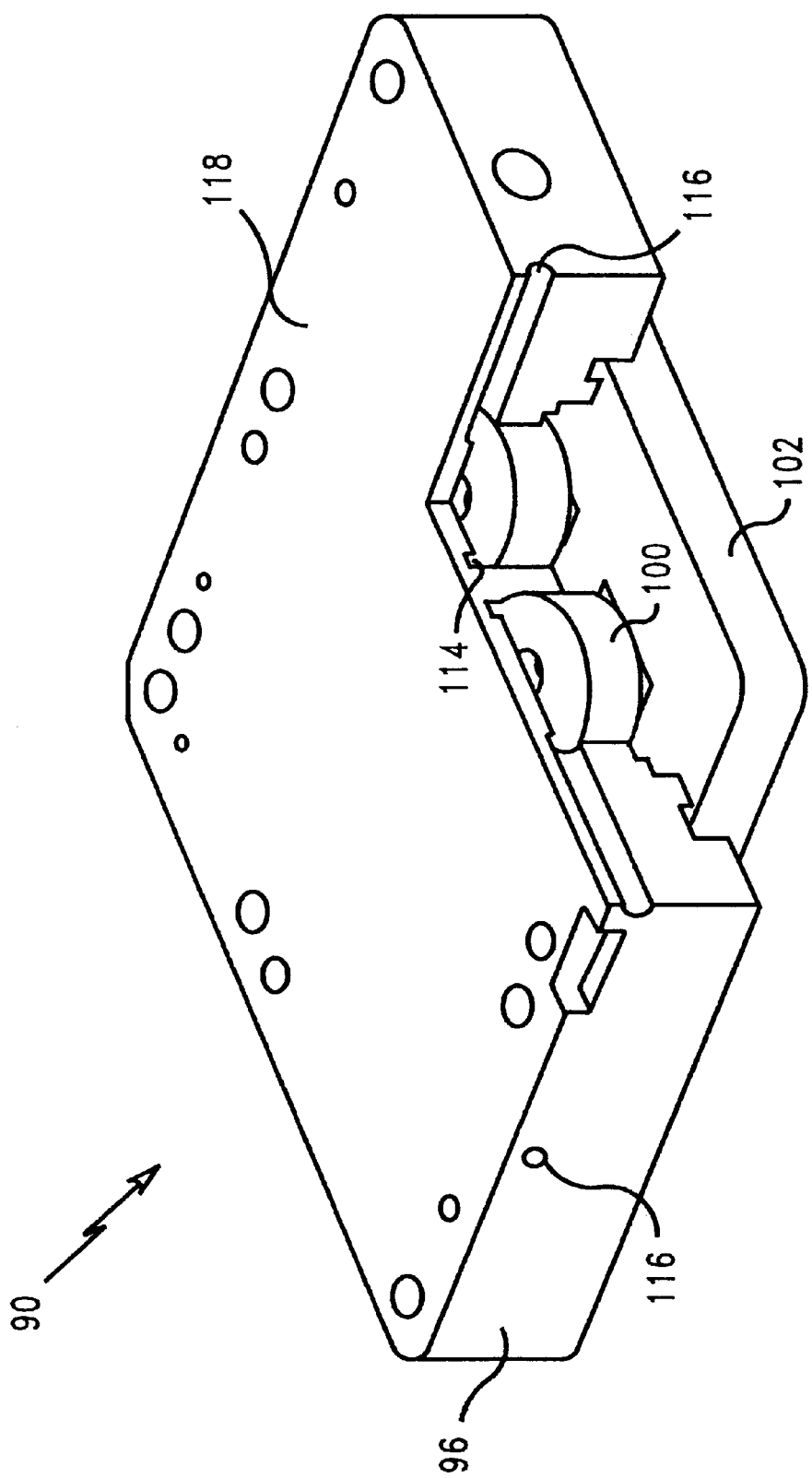
FIG. 5 is a cut away planar view of the assembled module shown in FIG. 3.

The module can then be disassembled. The covering plate 92, screws 91, substrate plate 102, shim 110 and springs 98 are preferably removed to be reused, leaving holding structure 96 with holding elements 100 in place in relation to integrated circuit 106 located on the substrate 102. The module is reassembled, as shown in FIGS. 4 and 5, with the holding elements 100 affixed to the holding structure 96. The holding structure and holding elements are encased between the substrate 102 and the top plate 118.

A gap is defined by the bottom of the cylindrical holding element 100 and the top of the integrated circuit 106. The gap is substantially the same vertical dimension or thickness of the removable shim 110. The gap is sustained by the soldered holding elements 100 maintaining their position in the holding structure 96. The module 90 allows the thickness of the shim to set a gap between the holding elements 100 in relation to each integrated circuit 106.

In another embodiment the holding element 100 could have a negative gap in relation to shim 110 and integrated circuit 106. In this case, the base 94 will hold springs (not shown in drawings) having a greater force than the springs 98 contacting the holding elements 100. Thus, springs are introduced between the base 94 and the substrate 102 such that the substrate 102 is spring loaded toward the holding elements 100. The base 94 contacts the bottom of the substrate 102, applying upward force to the holding elements 100 The integrated circuits and the shim 110 are thereby urged toward the bottom of the holding elements 100.

Referring to FIGS. 4 and 5, the module 90 is shown in its fixed position and having solder interfaces 112. Further, the module 90 includes vent holes 116 and vent channels 114 in the holding structure 96. Further, a top plate 118, as shown in FIG. 5, is preferably of copper and functions as an additional heat dissipater. Heat from the integrated circuits 106 is substantially dissipated via conduction from the integrated circuits to the solder interfaces 112, through the holding elements 100, and also through the top plate 118.

The operation of the present invention is described herein, referring to FIG. 1. The thermal conduction assembly kit 10 includes the substrate 14, which is designed to accept an integrated circuit 16. The cover and positioning ring 20 are designed to work in concert such that the positioning ring circumscribes the perimeter of the cover and is slidable in relation to the cover. The positioning ring 20 is placed on the base while the cover is vertically adjusted to be positioned on top of the shim member 22. Before the cover and positioning ring 20 are affixed together, they are adjusted to position the cover over the integrated circuit per a determined specification using the shim member 22. The cover and positioning ring 20 are then affixed together. The cover and attached positioning ring 20 are removed along with the shim member 22. Then, the cover 18 and affixed positioning ring are replaced such that the cover fits over the integrated circuit, contacts, and mates with the substrate 14, defining a gap between the top of the integrated circuit and the bottom surface of the cover. The gap has the vertical dimension of the shim member. The gap's vertical dimension can be adjusted as described above to accommodate variable amounts of thermal compound preferably varying from a film, to a substantial layer of thermally conductive compound. Once the gap size is determined, adjusted for and set, the desired amount of thermal compound as defined by the gap size can then be injected into the gap to enhance thermal conductivity. The finished assembly substantially dissipates heat via the thermal conductive compound, to the cover 18, and through any solder interfaces. Thus, heat is effectively dissipated away from the integrated circuits.

In the operation as described herein, and referring to FIGS. 2a and 2b, the apparatuses for deploying a thermal conduction module 40 have a thermal conduction module 80 mounted in the recessed portion of the bottom 48 of the enclosure structure 42. Referring to FIG. 2a, the application pusher 50 is removably affixed to the top of the cover. The cover is positioned over the integrated circuit and the shim is used to define the desired vertical distance between the integrated circuit and the bottom of the cover. The actuation handle 58 is manipulated forward and back pivoting about pivot point 59 to adjust the application pusher vertically up and down with the cover attached to the bottom 52 of the application pusher 50. The removable shim 86 has a specified vertical dimension so that according to the invention after the shim 86 is removed a desired gap will remain having the same specified dimension. The cover 82 attached to the bottom 52 of the application pusher 50 is adjusted using the handle 58 to attain a plurality of shim vertical dimensions. After the cover is adjusted via the handle 58 to accommodate the shim 86 the adjustment ring 62 is affixed to the outer edge of the cover 82.

Referring to FIG. 2b, the controlling member 51 is removably affixed to the positioning ring 62 and moves the positioning ring into place adjacent to the cover 82 where the positioning ring and cover are affixed. The cover with the adjustment ring attached can be lifted to remove the shim 86, and reassembled leaving a gap having the vertical dimension of the shim. The remaining gap is defined by the bottom of the cover and the top of the integrated circuit. The gap is maintained by the inner edge of the adjustment ring being attached to the perimeter of the cover, and the bottom of the adjustment ring contacting the substrate 84. The gap can be specified by the shim dimensions to accommodate from a film of conductive material, to a substantial layer of conductive material. A thermal compound 87 can then be injected into the gap to provide a module with enhanced thermal conductivity. The heat generated by the integrated circuit generally dissipates via the thermal conductive material, through solder interfaces, if any, and to the cover 82. Thus providing effective dissipation of heat away from the integrated circuits.

The operation of another embodiment of a thermal conduction module assembly kit 90 is described herein, and shown in FIGS. 3–5. The integrated circuits 106 are mounted in the substrate 102 and a removable shim element is placed between the cylindrical holding elements 100 and the integrated circuits 106. The removable shim has a specified thickness or vertical dimension. The cylindrical holding elements 100 are spring loaded in the downward direction towards the shim 110 by securing the holding elements with solder to the inner surface and edges of the openings 97. The module 90 is incrementally compressed by turning adjustment screws 91 through the mating apertures 93 in the cover, the holding structure 96, and the base 94.

Once the module is assembled using the screws 91, and any desired tilt caused by varying thicknesses of the shim element 110 is adjusted for by the adjustment screws 91, the module 90 is ready to be heated and cooled to set the gap between the integrated circuit and the bottom of the holding elements. The module is heated to a temperature which melts or liquefies the solder securing the holding elements in place, thereby releasing the holding elements by virtue of the spring tension and enabling the holding elements 100 to contact the shim 110. After the module 90 is cooled, the holding elements are re-secured to the inner surface and edges of the openings 97 by the solidifying solder. Once the cooling and solder solidification has taken place, the module is disassembled and the covering plate 92, the springs 98, the shim 110, and the base 94 can be removed. The holding structure 96 with affixed holding elements 100 can be reassembled to the substrate 102 with integrated circuits, including a top plate 118, preferably of copper to provide heat dissipation. A gap, having the same vertical dimension as the shim element, is now defined by the bottom surface of the holding element 100 and the top of the integrated circuit 106. A thermally conductive material can now be injected into the gap to enhance thermal conductivity.

Preferably, the top surface of the holding structure 96 and the top of the holding elements 100 are re-machined to provide a smooth top surface of holding structure 96. The top plate 118 is affixed to the top of the holding structure 96. The top plate 118 is preferably of a conductive material, such as, for example, copper.

Using the apparatus and method above, the gap can be defined to accommodate from a film, to a substantial layer of thermally conductive material. The heat generated by the integrated circuits is substantially dissipated via the thermally conductive material, through the holding elements 100 and the solder interfaces 112, and conducted to the top plate 118. Thereby, providing effective dissipation of heat away from the integrated circuits.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A thermal conduction module assembly kit which comprises:
    a base having top and bottom surfaces;
    a substrate having top and bottom surfaces, said substrate being adapted to receive on said substrate top surface at least one integrated circuit having top and bottom surfaces, said substrate being positioned on said top surface of said base;
    a cover having top and bottom surfaces and an outer edge surface, said cover adapted to be disposed over said substrate, said integrated circuit being positioned between said bottom surface of said cover and said top surface of said substrate;
    a removable spacer member having a definable vertical dimension positioned between said bottom surface of said cover and said top surface of said integrated circuit;
    a positioning member having top, bottom, and side surfaces, said side surface of said positioning member situated adjacent to and being affixable to said outer edge surface of said cover; and said bottom surface of said positioning member being contactable with said top surface of said substrate;
    said positioning member being slidable along said affixable side surface with respect to the outer edge surface of said cover, to contact the top surface of said substrate and maintain a specified vertical dimension between said bottom surface of said cover and said top surface of said integrated circuit; said specified vertical dimension defined by said vertical dimension of said removable spacer member.

2. The thermal conduction module assembly kit of claim 1 wherein there are a plurality of said covers that are affixable to said positioning member.

3. The thermal conduction module assembly kit of claim 1 wherein said bottom surface of said cover and said top surface of said integrated circuit define a gap having said specified vertical dimension when said affixable side surface of said positioning member is affixed to said outer edge surface of said cover, and said removable space member is removed; said gap being substantially filled with a thermally conductive medium.

4. A thermal conduction module assembly kit which comprises:
    a base having top and bottom surfaces;
    a substrate having top and bottom surfaces, said bottom surface of said substrate adapted to be situated on said top surface of said base;
    at least one integrated circuit having top and bottom surfaces, where said bottom surface of said integrated circuit is adapted to be positioned on said top surface of said substrate;
    a cover having top and bottom surfaces and an outer edge surface, said cover adapted to be disposed over said substrate, said integrated circuit being positioned between said bottom surface of said cover and said top surface of said substrate;

a removable spacer member having a definable vertical dimension positioned between said bottom surface of said cover and said top surface of said integrated circuit;

a positioning member having top, bottom, and side surfaces, said side surface of said positioning member situated adjacent to and being affixable to, said outer edge surface of said cover; and said bottom surface of said positioning member being contactable with said top surface of said substrate;

said affixable side surface of said positioning member to said outer edge surface of said cover, and said bottom surface of said affixable positioning member contactable to said substrate, capable of maintaining a specified vertical dimension between said bottom surface of said cover and said top surface of said integrated circuit; said specified vertical dimension defined by said vertical dimension of said removable spacer member;

said bottom surface of said cover and said top surface of said integrated circuit defining a gap having said specified vertical dimension when said affixable side surface of said positioning member is affixed to said outer edge surface of said cover, and said removable space member is removed.

said gap being fillable with a thermally conductive medium.

5. The thermal conduction module assembly kit of claim 4 wherein there are a plurality of said covers that are affixable to said positioning member.

6. The thermal conduction module of claim 4 wherein said gap is substantially filled with a thermally conductive medium.

7. The thermal conduction module of claim 4 wherein said positioning member at least partially circumscribes said cover.

8. The thermal conduction module of claim 4 wherein said positioning member and said cover are substantially circular in shape and said positioning member circumscribes an outer surface of the perimeter of said substantially circular cover.

9. A thermal conduction module assembly kit which comprises:

a base being substantially planar in shape and having a top surface;

a substrate positioned on said top surface of said base, said substrate being adapted to receive at least one integrated circuit having top and bottom surfaces;

a cover being substantially rectangular, having top and bottom surfaces and an outer edge surface, said cover designed to mate with said substrate such that said integrated circuit is positioned between said bottom surface of said cover and said top surface of said substrate;

a removable shim member being planar in shape and having a definable vertical dimension positioned between said bottom surface of said cover and said top surface of said integrated circuit to provide a specified dimension between said top surface of said integrated circuit and said bottom surface of said cover;

a positioning member having top, bottom, and inner surfaces, and being substantially circular; said inner surface of said positioning member positioned to circumscribe and movably mate with said outside surface of said cover; said inner surface of said positioning member being affixable to said outer edge surface of said cover; and said bottom surface of said positioning member being contactable with said top surface of said substrate;

said affixable inner surface of said spacer, and said bottom surface of said affixable positioning member, capable of maintaining said vertical dimension between said bottom surface of said cover and said top surface of said integrated circuit defined by said specified vertical dimension of said shim member, and defining a gap of the same said specified vertical dimension after said removable shim member is removed;

said gap substantially receiving a thermally conductive medium.

10. The thermal conduction module assembly kit of claim 9 wherein there are a plurality of said covers that are affixable to said positioning member.

11. An apparatus for deploying a thermal conduction module which comprises:

a structure defining an inner cavity;

said structure including an upper portion and a lower portion;

said upper portion of said structure defining an opening; a module;

said module including a substrate having a top and bottom surface, said bottom surface of said substrate being positioned on a top surface of said lower portion of said structure, and said substrate being adapted to receive at least one integrated circuit having top and bottom surfaces, where said bottom surface of said integrated circuit is positioned on said top surface of said substrate;

said module further including a cover having top and bottom surfaces and an outer edge surface;

said cover adapted to be disposed over said substrate;

said module further including at least one positioning member, said positioning member having an inner surface being adjacent to, and affixable to said outer edge surface of said cover;

said integrated circuit being positioned between said bottom surface of said cover and said top surface of said substrate;

said module further including a removable shim member having a definable vertical dimension and being positioned between said bottom surface of said cover and said top surface of said integrated circuit to provide a specified vertical dimension between said top surface of said integrated circuit and said bottom surface of said cover;

an application member positioned through said opening in said top of said structure;

an actuation member being connected to said application member for lifting said application member in a substantially vertical direction;

a least one adjustment element adjacent to said application member and connected to said application member so that both move synchronously, said adjustment element having a lower portion contacting an upper surface of said at least one positioning member;

said positioning member being vertically slidable by said adjustment element along said outer edge surface of said cover, such that said actuation member moves said adjustment element to position the positioning member in a desired adjacent position relating to said vertical dimension of said removable shim member.

12. The apparatus for deploying a thermal conduction module of claim 11 wherein there are a plurality of said covers that are affixable to said positioning member.

13. The apparatus of claim 11 wherein said inner cavity is substantially circular, and said cover and said positioning member are substantially circular such that said positioning member circumscribes said outer edge of said cover.

14. The apparatus of claim 11 wherein said inner cavity is substantially rectangular, and said cover and said positioning member are substantially rectangular such that said positioning member circumscribes said outer edge of said cover.

15. The apparatus of claim 14 wherein said affixable inner edge surface of said positioning member, and said bottom surface of said affixable positioning member, are coupled to maintain said vertical dimension between said bottom surface of said cover and said top surface of said integrated circuit defined by said specified, measurable vertical dimension of said shim member;

said bottom surface of said cover and said top surface of said integrated circuit defining a gap after said removable shim member is removed; and said gap has substantially the same said specified, measurable vertical dimension of said shim member;

said gap being substantially filled by a thermally conductive medium.

16. An apparatus for deploying a thermal conduction module assembly kit which comprises:

a structure defining an inner cavity;
said structure including an upper portion and a lower portion, said upper portion of said structure defining an opening;

a substrate having a top and bottom surface, said bottom surface of said substrate being positioned on a top surface of said lower portion of said structure;

at least one integrated circuit having top and bottom surfaces, where said bottom surface of said integrated circuit is positioned on said top surface of said substrate;

a cover being substantially rectangular, having top and bottom surfaces and an outer edge surface;
said cover adapted to be disposed over said substrate, said integrated circuit being positioned between said bottom surface of said cover and said top surface of said substrate;

a removable shim member being planar in shape and having a definable vertical dimension positioned between said bottom surface of said cover and said top surface of said integrated circuit to provide a specified dimension between said top surface of said integrated circuit and said bottom surface of said cover;

an application member positioned through said opening in said top of said structure;

an actuation member being connected to said application member for lifting said application member in a substantially vertical direction;

a least one adjustment element adjacent to said application member and connected to said application member so that both move synchronously, said adjustment element having a lower portion contacting at least one positioning member;

said positioning member having an inner surface being adjacent to, substantially circumscribing, and affixable to said outer edge surface of said cover;

said positioning member being vertically slidable by said adjustment element along said outer edge surface of said cover.

17. The apparatus of claim 16 wherein said affixable inner edge surface of said positioning member, and said bottom surface of said affixable positioning member, are coupled to maintain said vertical dimension between said bottom surface of said cover and said top surface of said integrated circuit defined by said specified, measurable vertical dimension of said shim member;

said bottom surface of said cover and said top surface of said integrated circuit defining a gap after said removable shim member is removed; and said gap has substantially the same said specified, measurable vertical dimension of said shim member;

said gap being substantially filled by a thermally conductive medium.

18. The apparatus of claim 17 wherein said bottom portion of said structure includes a top surface defining a recess, said recess is adapted to hold said substrate.

19. The apparatus of claim 17 further comprising: at least one spring positioned between a bottom surface of said top portion of said substantially rectangular structure and said top surface of said application member;

said spring providing substantially downwardly transmitting force on said application member for articulation of said application member by said actuation member, and forgivingly providing pressure to said positioning member.

20. A method of assembling a thermal conduction module having a base plate for holding at least one integrated circuit chip mounted on a chip substrate; a cover plate having a surface facing the chip substrate; a positioning member adjacent to said cover plate; and an application member removably fastened to the cover plate, said application member being adjustable to a predetermined distance from the cover plate or base plate, said method comprising the steps of:

placing a substrate on the base plate;

placing at least one integrated circuit chip on the substrate;

placing a removable shim member over an upper surface of the substrate and, at least one integrated circuit chip, said shim member having a thickness corresponding to a thickness sufficient to permit a thermally conductive medium to be disposed between an upper surface of the integrated circuit chip, when located on the chip substrate, and the cover plate surface facing the chip substrate, when the shim member is removed;

placing the cover plate over the shim member, the integrated circuit chip, if present, the substrate and the base plate;

adjusting the application member toward or away from the base plate, until said surface facing the chip substrate of said cover plate contacts the shim member creating a desired distance for insertion of a thermally conductive material between an upper surface of an integrated circuit chip mounted on the chip substrate and said cover plate surface facing the chip substrate;

affixing said positioning member to said cover plate;

removing said cover plate with affixed positioning member and shim member from over the substrate;

replacing said cover plate with affixed positioning member over the substrate and the base plate;

securing said cover plate with affixed positioning member to the base plate, whereby a desired gap is created for a thermally conductive medium between an upper surface of said integrated circuit and said cover plate surface facing the chip substrate; and inserting said thermally conductive material into said gap.

21. A thermal conduction module assembly kit which comprises:

a top cover having top and bottom surfaces;

a structure having upper and lower surfaces, said upper structure surface being matable with said lower surface of said top cover;

at least one holding element having a top surface and a bottom surface; said holding element being resiliently and removably coupled to said structure such that said holding element is movable in a substantially vertical direction;

at least one integrated circuit having an upper surface;

a substrate member having an upper surface and a bottom surface, said upper surface of said substrate member being adapted to mount said integrated circuit;

a base having an upper surface, said upper surface of said base being adapted for said substrate member to be positioned on said base upper surface;

a removable shim element being adapted to fit over said at least one integrated circuit, and said removable shim element being positioned between said integrated circuit and said holding element; said removable shim element having a specified thickness;

said removable shim element specified thickness defining the distance between said upper surface of said integrated circuit and said holding element;

said holding element and said structure being couplable;

said top cover and said structure coupling to said substrate base such that said holding element, removable shim element and said integrated circuit mounted in said substrate member are adapted to adjust to said specified thickness of said removable shim element; said specified thickness of said removable shim element defining a specific vertical dimension between said upper surface of said integrated circuit and said holding element.

22. The thermal conduction module assembly of claim 21 wherein said holding element is coupled to said structure and said removable shim element is removed; said upper surface of said integrated circuit and said holding element defining a gap; said gap being substantially the same as the vertical dimension of said removable shim element; and said gap being substantially filled by a thermally conductive medium.

23. The thermal conduction module assembly of claim 21 wherein said holding element defines at least one opening, said opening designed to receive said resilient element and said holding element such that said holding element is capable of substantially receding into said opening while maintaining forgiving contact with said integrated circuit.

24. The thermal conduction module assembly of claim 21 wherein said holding element defines at least one aperture providing ventilation for said gap.

25. The thermal conduction module assembly of claim 21 further including adjustment elements passing through said top cover, said structure, and said base which can provide incremental changes in the positioning of the holding elements as said holding elements contact said removable shim.

26. A thermal conduction module assembly kit which comprises:

a top cover having top and bottom surfaces;

a structure having upper and lower surfaces, said upper structure surface being matable with said lower surface of said cover, said structure defining at least one aperture;

at least one holding element having a top surface and a bottom surface, said holding element being removably coupled to said structure by a resilient element such that said holding element is movable in a substantially vertical direction, said aperture of said structure being adapted to accept said holding element such that said holding element is capable of resiliently vertically adjusting within said aperture;

at least one integrated circuit having an upper surface;

a substrate member having an upper surface and a bottom surface, said upper surface of said substrate member being adapted to mount said integrated circuit;

a base having an upper surface, said upper surface of said base being adapted for said substrate member to be positioned on said base upper surface;

a removable shim element being adapted to fit over said at least one integrated circuit, and said removable shim element being positioned between said integrated circuit and said holding element, said removable shim member having a defined thickness;

said removable shim element defined thickness defining the distance between said upper surface of said integrated circuit and said holding element;

said holding element and said structure being couplable;

said top cover and said structure coupling to said substrate base such that said holding element, removable shim element and said integrated circuit mounted in said substrate member are adapted to adjust to said thickness dimension of said removable shim element, said defined thickness of said removable shim element defining a specific vertical dimension between said upper surface of said integrated circuit and said holding element.

27. The thermal conduction module of claim 26 wherein said holding element is affixed to said structure and said removable shim element is removed, said upper surface of said integrated circuit and said holding element defining a gap, said gap being substantially the same as the vertical dimension of said removable shim element, said cover being affixed to said substrate base, said gap being substantially filled by a thermally conductive medium.

28. The apparatus of claim 26 wherein said holding element defines at least one aperture providing ventilation of said gap.

29. The apparatus of claim 26 wherein said holding element comprises a plurality of substantially circular apertures.

30. The apparatus of claim 26 wherein said cover defines at least one aperture for venting said module.

31. The apparatus of claim 26 wherein said cover defines at least one aperture for venting said module, and said aperture extends through said cover a specified distance reaching said upper surface of said integrated circuit.

32. The apparatus of claim 26 further including fastening elements passing through said top cover, said structure, and said base coupling said top cover to said base and providing adjustments in the positioning of said holding elements relative to said shim.

* * * * *